United States Patent [19]

Brennian, Jr. et al.

[11] Patent Number: 5,318,452
[45] Date of Patent: Jun. 7, 1994

[54] ELECTRICAL CONNECTOR

[75] Inventors: Ronald W. Brennian, Jr., Columbia; Robert S. Correll, Jr., Harrisburg; John A. Fortuna, Mechanicsburg, all of Pa.

[73] Assignee: The Whitaker Corporation, Wilmington, Del.

[21] Appl. No.: 926,628

[22] Filed: Aug. 10, 1992

[51] Int. Cl.5 ............................................. H01R 9/09
[52] U.S. Cl. ..................................... 439/79; 439/540; 439/64
[58] Field of Search .................. 439/59, 78, 79, 80, 439/83, 64, 377, 540, 444, 733, 873

[56] References Cited

U.S. PATENT DOCUMENTS

| | | | |
|---|---|---|---|
| 3,768,066 | 10/1973 | Mattingly, Jr. et al. | 439/377 |
| 3,801,953 | 4/1974 | Lynch | 439/377 |
| 4,583,807 | 4/1986 | Kaufman et al. | |
| 4,621,880 | 11/1986 | Rush | 439/79 X |
| 4,732,365 | 3/1988 | Kloster | 254/10.5 |
| 4,756,696 | 7/1988 | Whiteman, Jr. | 439/79 |
| 4,992,052 | 2/1991 | Verhoeven | 439/62 |
| 5,030,115 | 7/1991 | Regnier et al. | 439/540 X |
| 5,112,234 | 5/1992 | Johnson et al. | 439/79 |
| 5,201,662 | 4/1993 | Roche | 439/79 |

FOREIGN PATENT DOCUMENTS

| | | | |
|---|---|---|---|
| 0215063 | 8/1990 | Japan | 439/79 |
| WO01540 | 4/1983 | PCT Int'l Appl. | 439/79 |

OTHER PUBLICATIONS

Memory/PC Card Connector (Compatible with PCMCIA, Release 2.0; AMP Incorporated; Dec. 1991. PC Card Standard, Release 2.0, Personal Computer Memory Card International Association (PCMCIA); Sep. 1991.

*Primary Examiner*—Larry I. Schwartz
*Assistant Examiner*—Khiem Nguyen

[57] ABSTRACT

An electrical connector 10 for mounting on a circuit board 11 is provided comprising a first row of passages and a second row of passages which communicate a front surface 14 and a rear surface 16 of a housing 12, the passages being positioned in parallel rows, with each passage of a given row being vertically aligned with a corresponding passage in the other row. First electrical contacts 26 are retained in the first row of passages, and second electrical contacts 30 are retained in the second row of passages. The electrical contacts 26,30 comprise post sections 68 which extend forwardly from the front surface 14 of the housing 12, intermediate section 70 which are retained in the passages, and tail sections 22 which extend rearwardly and downwardly from the rear section 16 of the housing 12 to a free end 84 which is disposed to connect with an electrical connector on the circuit board 11, such as a conductive pad, 38. The tail sections 36 of the first electrical contacts 26 extend rearwardly and downwardly in a first plane, and the tail sections 34 of the second electrical contacts 30 extend rearwardly and downwardly in a second plane which is different from the first plane, thus enabling ease of visual inspection and repair of the connections of the free ends 84 of the tail sections 34 of the second electrical contacts 30 to the conductive pads 38 of the mounting surface 11.

9 Claims, 13 Drawing Sheets

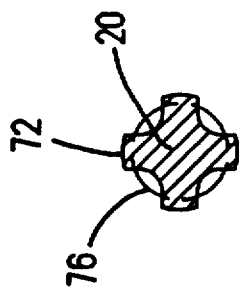
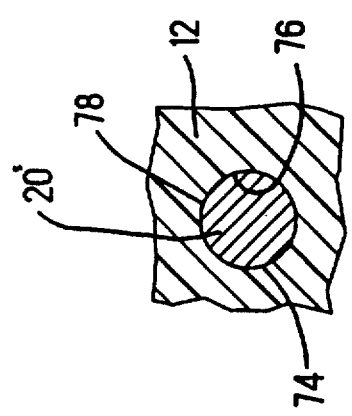
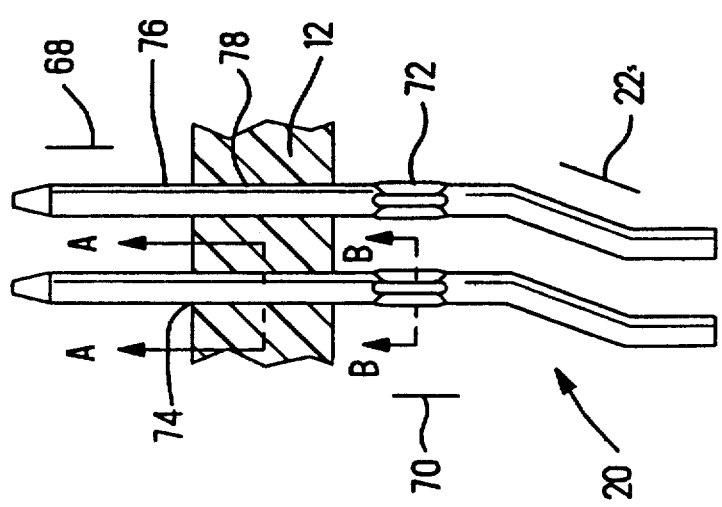

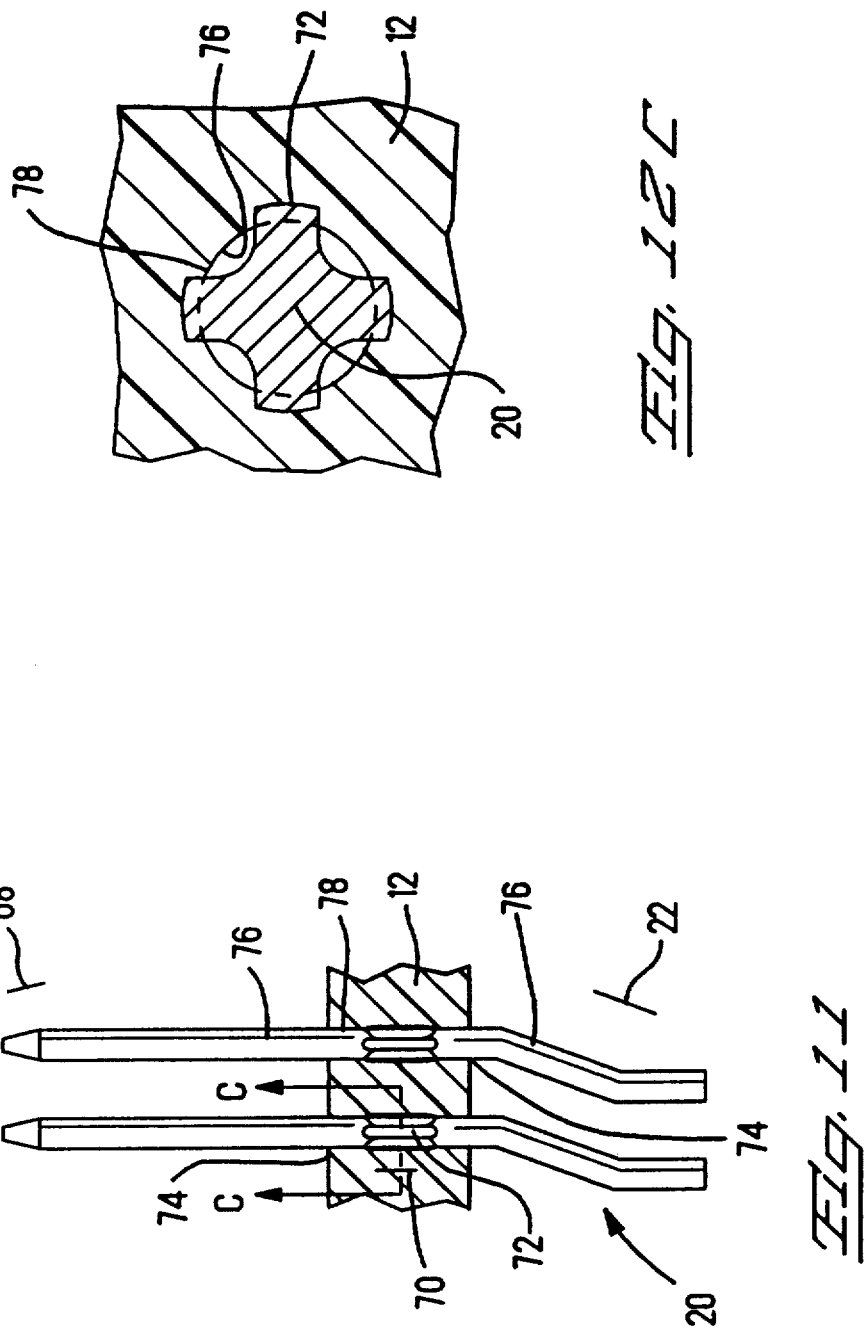

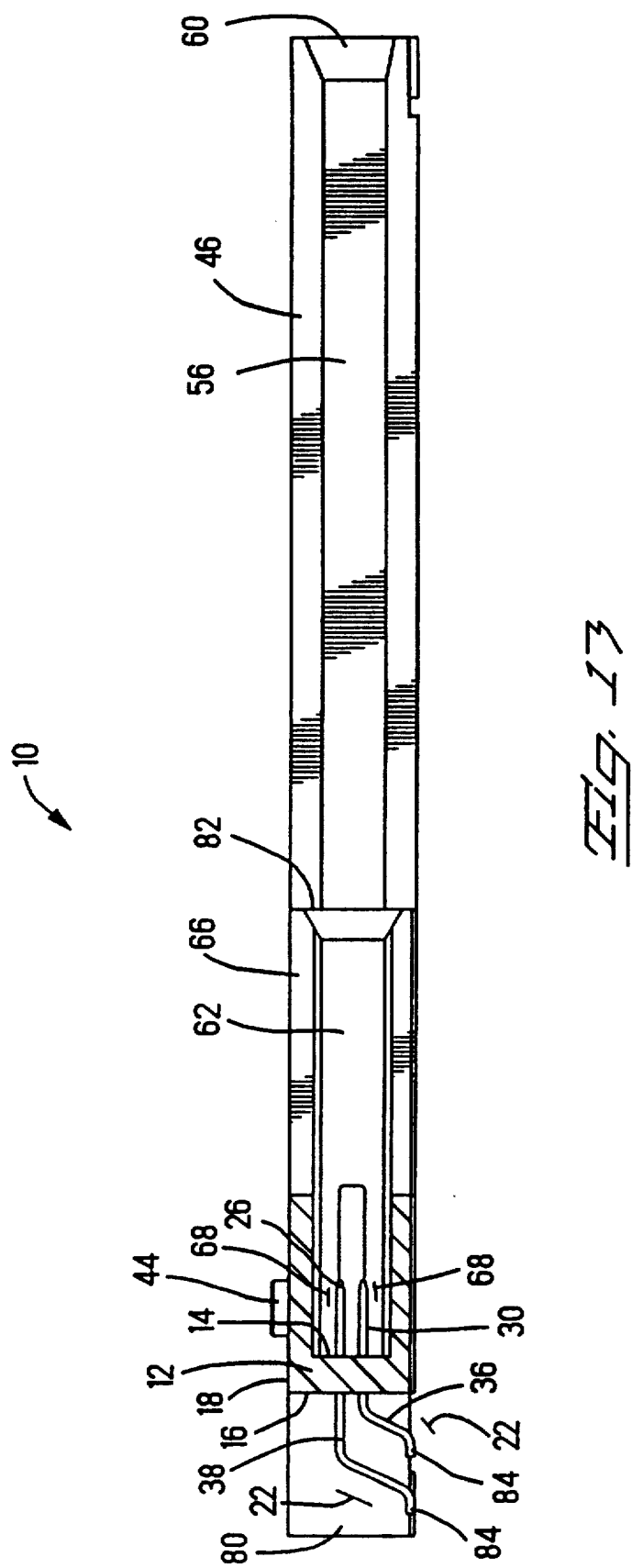

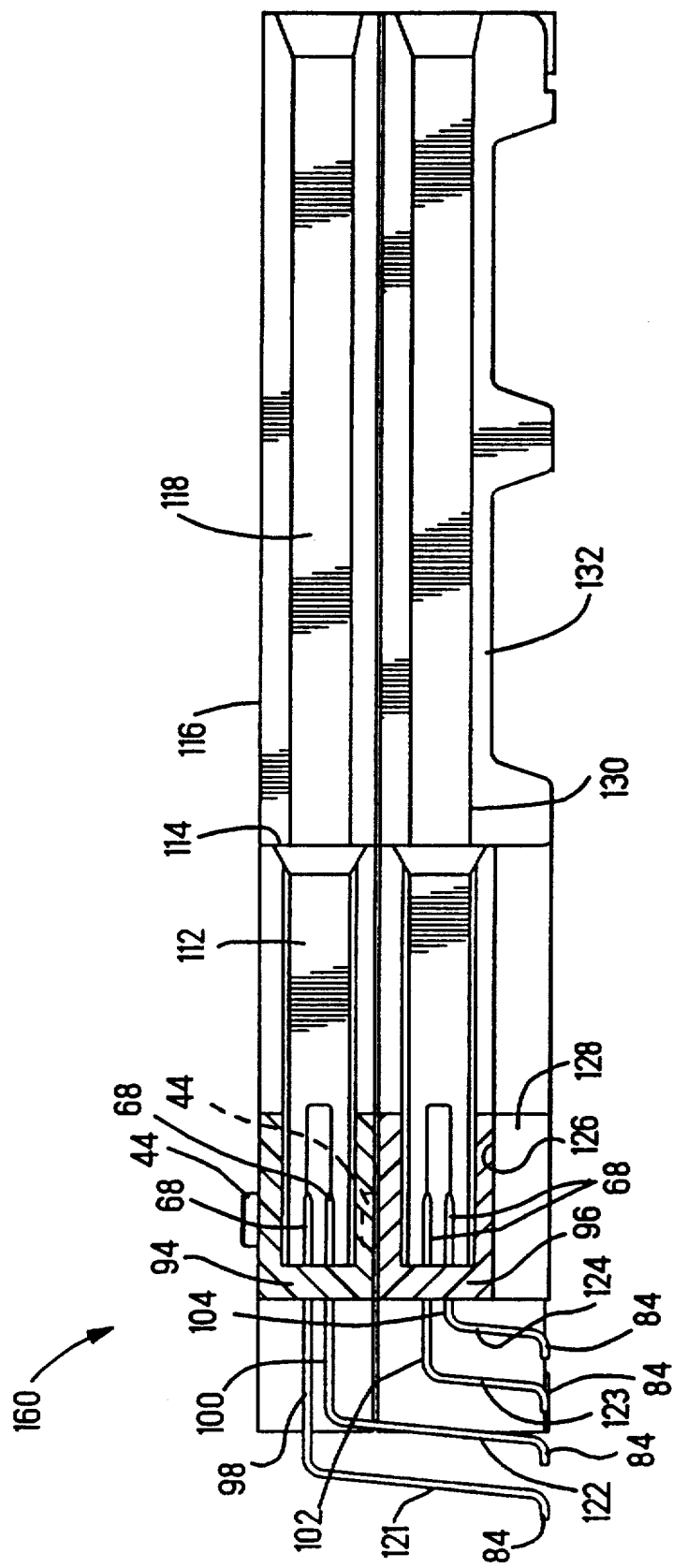

ELECTRICAL CONNECTOR

FIELD OF THE INVENTION

The present invention relates to electrical connectors and, more particularly, to circuit board mounting type electric connectors which are suitable for making an electrical connection between a mounted modular connector with a high contact density of contacts and the circuit board.

BACKGROUND OF THE INVENTION

Prior art and contemporary connectors of the type disclosed herein are fixed to circuit boards in a number of ways. For convenience and flexibility, it has been known to manufacture electronic circuits and their connectors in a modular design for installation onto printed circuit boards of standard dimensions. Connectors have been fixed to circuit boards in several ways. For example, leads or pins may be inserted into holes in the circuit board and either soldered therein, or retained by other means, such as frictional retention means or spring means, which prevent the pin from exiting the hole in the circuit board. Conductive pads may be incorporated into the board onto which the contacts are soldered forming either a perpendicular or a parallel mount.

In present day electronics, miniaturization has led to the installation of a large number of electronic components onto a circuit board so that a large number of functions can be performed by the circuitry on the board. Consequently, the number of terminals needed for connection to other electronic components has increased, necessitating the need for high contact density, i.e., connectors having a large number of electrical contacts or terminals per unit volume.

Such connectors have been used in many applications where a surface mounted device necessitates connection of electrical contact terminals to the circuitry on the circuit board. Such applications have included, among others, memory card connections and other devices intended to introduce external input into the circuit system, as well as internal circuitry devices, such as additional circuitry, capacitors, resistors and other electronic components. For example, in the electrical connector industry, it is well known to provide an electrical connector useful for signal transmission and reception between a memory card and the circuit of a machine concerned. For reference, the Personal Computer Memory Card International Association ("PCMCIA") established memory card (or "PC Card") standards defining the PC Card's physical outline standards, connector system and qualification test parameters, including reliability, durability and environmental test parameter. PC Card Standard, Release 2.0, PCMCIA (September 1991).

Connectors having the capability of housing a high density of electrical contacts are shown in for example, U.S Pat. No. 4,583,807 issued to Kaufman et al., wherein contacts are positioned in parallel rows along the longitudinal axis of the connector housing, with tail sections extending rearwardly and downwardly from the housing which are soldered to the board.

Contact density, however, cannot generally be increased by simply placing the contacts closer together or by forming several rows of contact elements located one above the other. Increasing density in this way may result in undesirable mutual electrical interference between the contact elements, and further, the use of very long tails on contacts will increase problems due to the occurrence of undesirable inductive couplings and susceptibility to electromagnetic noise. An example of a modular connector system which cures some of these problems is U.S Pat. No. 4,992,052 issued to Verhoevan, showing a connector module with a high contact density wherein the contacts are positioned in rows, and the end of a contact in the upper row and the end of a contact in a lower row are mutually displaced, such as by offsetting the connecting ends to extend within a side edge of a base section.

Another problem in the prior art connectors has been in determining the integrity of the soldering joint affixing the contact to the circuit board. In industry, solder joint integrity has generally been accomplished through visual inspection, with an inspection device, such as a detector beam, used to view the solder joint. As shown in FIGS. 1 and 2, this has been a problem where multiple rows of contacts 20', one above the other, are present in the connector module 10', and the connections include bent tail sections that contact the circuit board in a line extending from the housing 12'. When multiple rows of contacts 20' are present in this configuration, the contact points 38' of the lower rows of contacts with the circuit board are hidden from view by the extending electrical contacts 20' of the upper rows of contacts. In these devices, the contact solder joint most proximate to the circuit board is hidden from the line of sight extending perpendicularly from the board, making visual inspection difficult. Moreover, repair of such a solder joint is difficult.

One attempt to solve this problem is disclosed in U.S. Pat. No. 4,732,365 issued to Ito et al. which describes an electrical connector having a plurality of pins defining a connecting portion for connecting the pins to an electrical element and a terminal portion for connecting the pins to one conductor of a printed circuit board. As described in FIG. 2 of Ito et al., a pin header (20) consists of a main body (22) having a plurality of pins (24) arranged in two parallel rows at the female connector side. The pins (24) are deformed within the main body so as to project from the main body (22) with the upper row forming a straight row of the terminal portions nearer the main body (22) and the lower row pins forming a straight line of the terminal portions further from main body (22). As evident, Ito et al. requires that the pin header (20) be molded around the pins (24) in order to accommodate the deformed shape of the pins (24) in the main body (22). Another attempt to solve this problem is disclosed in U.S Pat. No. 4,756,696 issued to Whiteman, where the parallel rows of contacts are offset so that a contact extending from an upper row alternately forms a connection with the circuit board from a contact extending from the lower row, the connections all being soldered on the circuit board in a single line.

While the above described patents disclose improved techniques for mounting high density electrical connectors onto a circuit board, none provides the important advantage of a high density electrical connector wherein the integrity of the solder joint or connection between the electrical contacts and the circuit board is readily susceptible to visual inspection, an also to inspection through the use of optical detectors commonly used in industry. Moreover, none of these devices discloses a high density electrical connector with the simplified repair ability of defective solder joints. Also, none of these devises discloses high density devices which may be stacked one on top of the other.

SUMMARY OF THE INVENTION

It is an object of the present invention to provide a high density electrical connector in which the connections between the electrical contacts of the connector assembly and a circuit board are readily susceptible to visual inspection, and also to detection through the use of optical detectors such as those used in the circuit board manufacturing industry, in order to check the integrity of the connector joint.

According to the present invention, an electrical connector for mounting on a circuit board comprises a housing comprising a first passage disposed above a second passage with each of the passages disposed to communicate a front surface and a rear surface of the housing.

A first electrical contact is retained in the first passage and a second electrical contact retained in the second passage. The first and second electrical contacts comprise post sections, intermediate sections and tail sections, the post sections extending forwardly from the front surface of the housing, the intermediate sections retained in the passages and the tail sections extending rearwardly and downwardly from the rear surface of the housing. The tail section of said one of the contacts is rotated about its housing axis to define a first plane and the tail section of the second contact defines a second plane different from the first plane whereby the tail sections of the first and second electrical contacts are disposed in either the first or second planes, respectively, to be connected to corresponding first and second contact points on the circuit board via connecting means in such a way that the connecting means of the contact point of the first electrical contact and the contact point of the second electrical contact to the circuit board being readily susceptible to visual inspection.

Further an electrical connector for mounting on a printed circuit board comprises a housing assembly comprising a lower housing and an upper housing positioned in stacked relationship to the lower housing. The housing assembly has first, second, third and fourth parallel rows of passages disposed to communicate a front surface and a rear surface of the assembly, with the upper housing having the first row of passages being located above the second row of passages, and the lower housing having the third row of passages located above the fourth row of passages, each row of the passages extending substantially straight.

A plurality of electrical contacts is retained in the passages of the first, second, third and fourth rows, the contacts comprising post sections, intermediate sections and tail sections, the post sections extending forwardly from the front surface of the housing, the intermediate sections retained in the passages and the tail sections extending rearwardly and downwardly from the rear surface of the assembly. The electrical contacts retained in the first, second, third and fourth rows of passages being disposed such that the tail sections of the electrical contacts retained in one of the rows of passages define a first plane, the tail sections of the electrical contacts retained in another of the rows of passages define a second plane, the tail sections of the electrical contacts retained in another of the rows of passages define a third plane, and the tail sections of the electrical contacts retained in another of the rows of passages define a fourth plane; the tail sections of each of the electrical contacts are disposed within the first, second, third, and fourth planes to be connected to a corresponding contact point on the circuit board via a connecting means in such a way that the contact point of an electrical contact retained in the first row of passages being furthest from the housing and the contact points of the electrical contacts retained in the second, third and fourth rows of passages being progressively closer to the housing, respectively, and the contact points of at least three of the rows of contacts being readily susceptible to visual inspection.

Still further, a method for assembling an electrical connector for mounting on a circuit board comprises:

(1) providing a housing comprising a first and a second passage disposed to communicate a front surface and a rear surface of the housing, the first passage being disposed above the second passage and extending substantially straight through the housing;

(2) providing a first electrical contact to be retained in the first passage and a second electrical contact to be retained in the second passage, the first and second electrical contacts comprising post sections, intermediate sections and tail sections, the post sections extending forwardly from the front surface of the housing, the intermediate sections disposed to be retained in the passages and the tail sections disposed to extend rearwardly and downwardly from the rear surface of the housing, (3) inserting the post section of one of the electrical contacts from the front surface of the housing into the respective passage towards the rear of the housing until a portion of the intermediate section nearest the tail section remains outside of the respective passage;

(4) rotating the tail section of one of the electrical contacts of step (3) about the axis of the respective passage thereby displacing the tail sections to define an inclined second plane having other than vertical alignment with the respective passage;

(5) fully inserting the intermediate section of one of the electrical contacts of step (4) into the respective passage of the housing while maintaining the rotational position of the tail section of the electrical contact to extend rearwardly and downwardly in a second plane;

(6) inserting the post and intermediate portions of the other electrical contact into the other passage of the housing in a manner where the tail section of the other electrical contact extends rearwardly and downwardly in a first plane the tail sections of the first and second electrical contacts are disposed to be connected to a corresponding contact point on the circuit board via connecting means in such a way that the first and second electrical contacts are readily susceptible to visual inspection.

Still further, the method of assembling an electrical connector for mounting on a printed circuit board comprises:

providing a housing having first and second parallel rows of passages disposed to communicate a front surface and a rear surface of the housing, the first row of passages being nearest a top surface of the housing and the second row of passages being below the first row of passages, each row of the first row of passages extending substantially straight and being vertically aligned with a corresponding row in the second row of passages;

providing electrical contacts retained in the passages comprising post sections, intermediate sections and tail sections, the post sections extending forwardly from the front surface of the housing, the intermediate sections being adapted to be retained in the passages, and the tail sections adapted to extend rearwardly and downwardly from the rear surface of the housing for connection to a circuit board;

inserting one row of the electrical contacts into one of the parallel rows of the passages, rotating the electrical contacts so that the tail ends of the electrical contacts retained in the row of passages define a first inclined plane;

inserting the other row of the electrical contacts into the other row of the parallel rows of the passages so that the tail ends of the other electrical contacts retained in the other row of passages define a second plane; and providing connecting means for connecting the tail ends of the contacts to a contact point on the circuit board and connecting the tail ends of the contacts to the contact points, the contact point of each row of the contacts being readily susceptible to visual inspection.

As pointed out in greater detail below, the electrical connector of this invention provides important advantages. It is an advantage of this invention to provide for an electrical connector assembly with a high density of electrical contacts, wherein the connections between the electrical contacts of the connector and a circuit board are readily susceptible to visual inspection by optical devices now commonly used in industry.

The invention itself, together with further objects and attendant advantages, will best be understood by reference to the following detailed description taken in conjunction with the accompanying drawings.

BRIEF DESCRIPTION OF THE DRAWINGS

FIG. 10 is a partial cross sectional view of the electrical contacts of a connector according to the present inventions with the electrical contacts not fully inserted into a housing;

FIG. 11 is a cross-sectional view of an electrical contact inserted inside a passage;

FIGS. 12a, 12b, and 12c show a cross-sectional views of an electrical contact including retaining ridges for securing the contact against the walls of a passage;

FIG. 13 is a cross-sectional view of an assembled electrical connector shown in FIG. 3 taken along the x—x axis;

FIG. 17 is a cross-sectional view of a variation of an electrical connector according to the present invention;

DETAILED DESCRIPTION OF THE INVENTION

Figure 1:
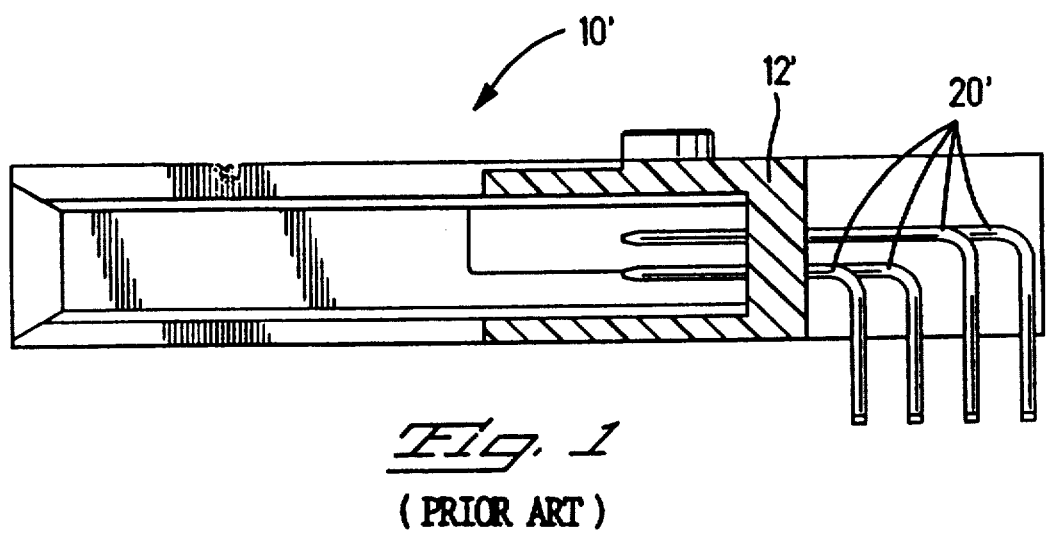
FIG. 1 is a cross-sectional view of a prior art connector.
Figure 2:
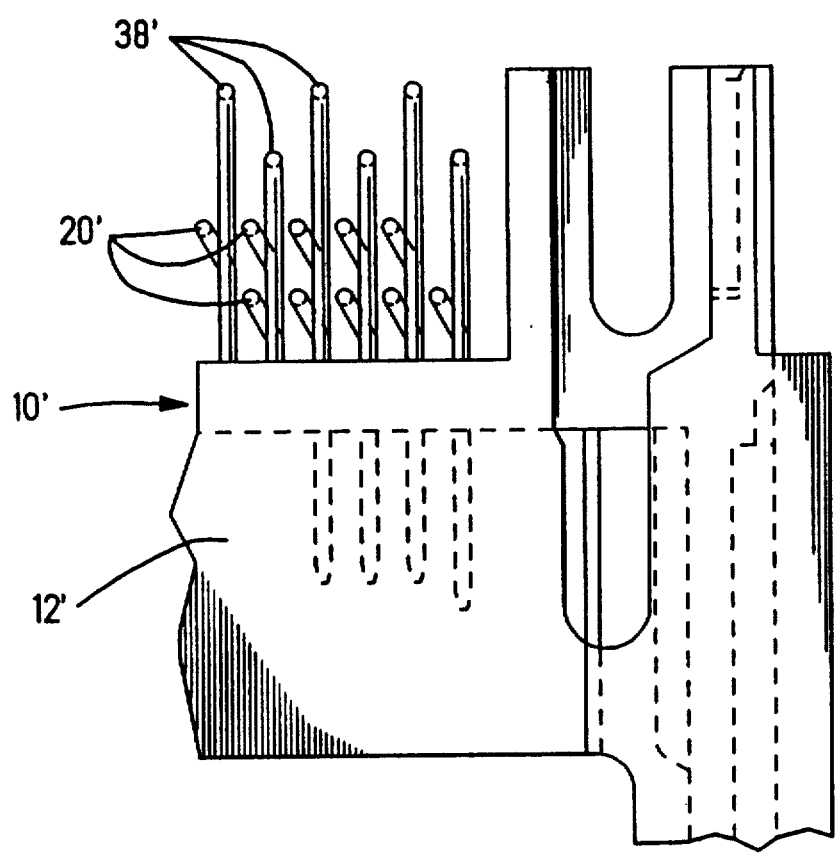
FIG. 2 is a partial top view of the prior art connector in FIG. 1.
Figure 3:
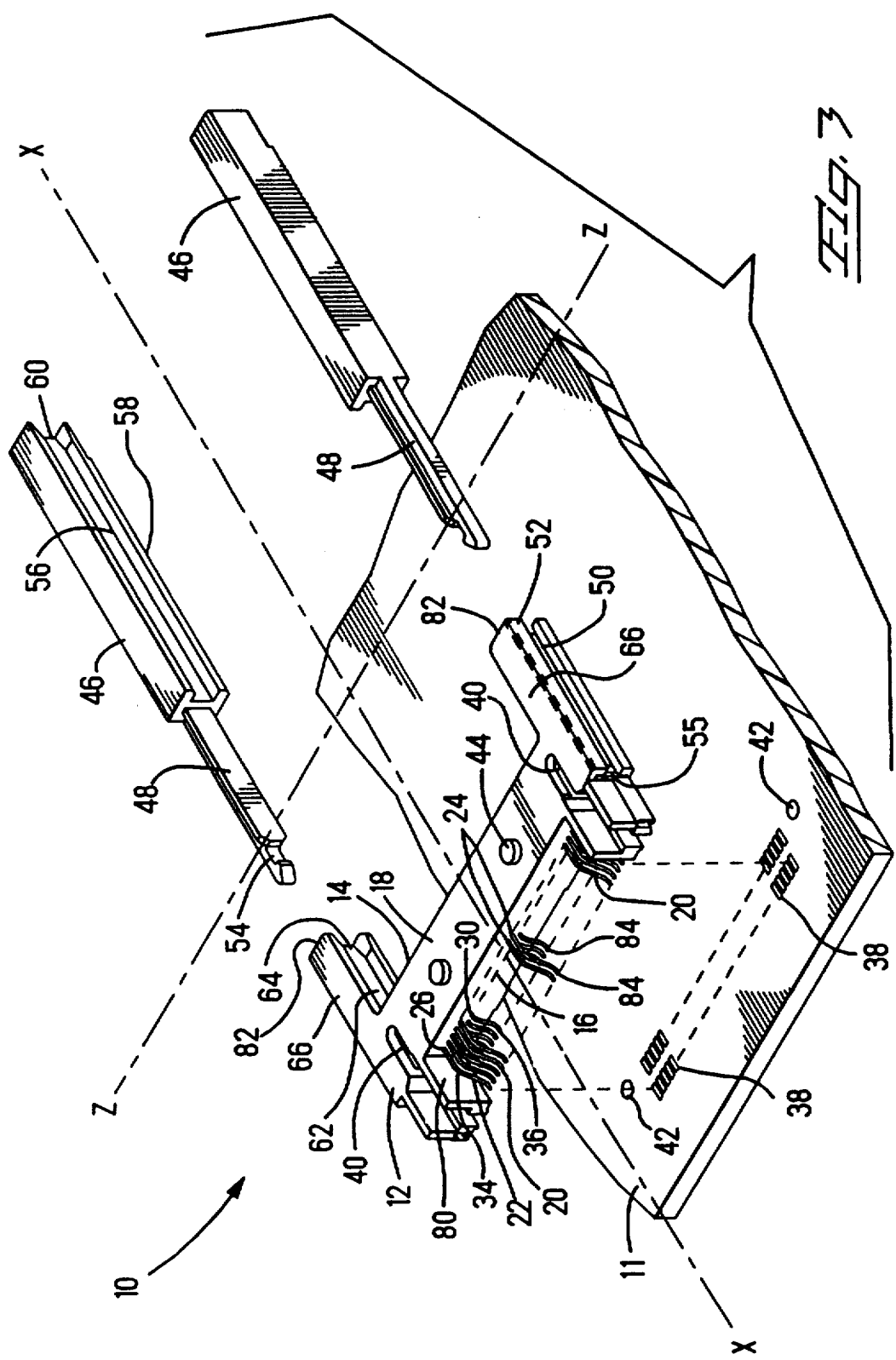
FIG. 3 is an exploded perspective view of an electrical connector according to the present invention.

Turning now to the drawings, FIG. 3 illustrates an exploded perspective view of a presently preferred embodiment of an electrical connector 10 according to the present invention. The electrical connector 10 is designed to receive a memory card (not shown) and provide an electrical connection between the memory card (not shown) and a circuit board 11. As shown in FIG. 3, a housing 12 is provided comprising a front surface 14, a rear surface 16, a top surface 18 and a bottom surface (not shown).

Electrical contacts 20 are retained in the housing 12, the electrical contacts 20 comprising a tail section 22, an intermediate section (not shown) which is retained in a passage (not shown) in the housing 12, and a post section (not shown) which extends from the rear surface 16 of the housing 12. The electrical contacts 20 are arranged in parallel rows 24, corresponding to parallel rows of passages (not shown) in the housing 12, the rows extending along the z-z axis of the housing 12, with each electrical contact in a given row vertically aligned with a contact in the other row. First electrical contacts 26 are retained in a first row of passages nearest to the top surface 18 of the housing 12. The second electrical contacts 30 are retained in a second row of passages below the first electrical contacts 26 and nearest the bottom surface (not shown) of the housing 12, which passages extend horizontally from the front surface 14 to the housing 12 to the rear surface 16 of the housing 12.

Figure 8:
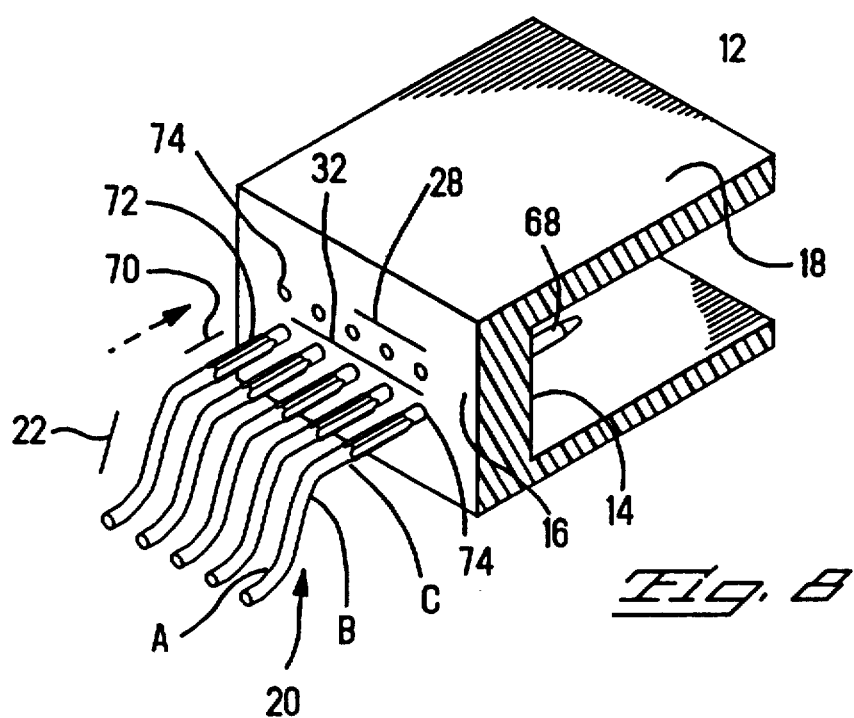
FIG. 8 is a perspective view of an unassembled electrical connector according to the present invention showing the housing and rotated electrical contacts with the post end inserted into the second row of passages.

The tail sections 22 of the electrical contacts 26,30 extend rearwardly and downwardly from the housing 12 to a free end, or foot, 84. The tail sections 34 of the first electrical contacts 26 extend rearwardly and downwardly from the rear surface 16 of the housing 12 in a first plane extending substantially perpendicular to the circuit board 11, while the tail sections 36 of the second electrical contacts 30 extend rearwardly and downwardly in a second plane (as shown in FIG. 8) which is different than that of the first plane and at an acute angle with respect to the circuit board 11. By rearwardly and downwardly it is intended to include embodiments wherein the electrical contact 20 extends away from the housing 12 toward a conductive pad 38 on which the housing is mounted. By way of example, FIG. 3 shows an electrical contact 20 extending perpendicularly from the rear surface 16 of the housing 12, and then angled towards the circuit board 11. Other embodiments, however, are envisioned. By way of further example, the contacts should be angled towards the circuit board immediately from the housing 12. Other embodiments can be envisioned in light of the present disclosure without departing from the spirit of the invention.

The free ends 84 of the tail sections 34,36 of the electrical contacts 26,30 are disposed to be connected to contact points, which are conductive pads 38, situated on the circuit board 11 in two parallel lines. When connected to the conductive pads, 38 of the circuit board 11, the free ends 84 of the electrical contacts 26,30 are parallel to the circuit board 11.

As further shown in FIG. 3, the housing 12 comprises a fitted opening 40 which is situated to line up with an aperture 42 on the circuit board 11 so as to receive securing means (not shown) to secure the housing 12 to the circuit board 11. Fitted openings 40 include side surfaces 80 in between which the tail sections 34,36 of the electrical contacts 26,30 are positioned. Means to ensure proper polarization 44 are positioned on the top surface 18 of the housing 12.

Guide arms 46 are shown which are adapted to attach to the housing 12. An extended prong 48 is shown which is adapted to fit into a guide arm guide groove 50 on the side surface 52 of the housing 12. A locking latch 54 is disposed on the end of the extended prong 48 of the guide arm 46 which is disposed to fit a latch shoulder 55 on the side surface 52 of the housing 12, the locking latch 54 is disposed to lock the guide arm into position on the housing 12, thereby securing the guide arm 46 to the housing 12 in proper position. A guide arm groove 56 on the inside surface 58 of the guide arm 46 comprises a groove mouth 60 adapted to receive a memory card or other external circuitry medium. The guide arm groove 56 is adapted to correspond to a groove 62 on the inside surface 64 of a housing arm 66 which extends from the rear surface 16 of the housing 12, such that a continuous groove is formed from the groove mouth 60 to the rear surface 16 of the housing 12 upon assembly of the guide arms 46 with the housing 12.

Figure 4:
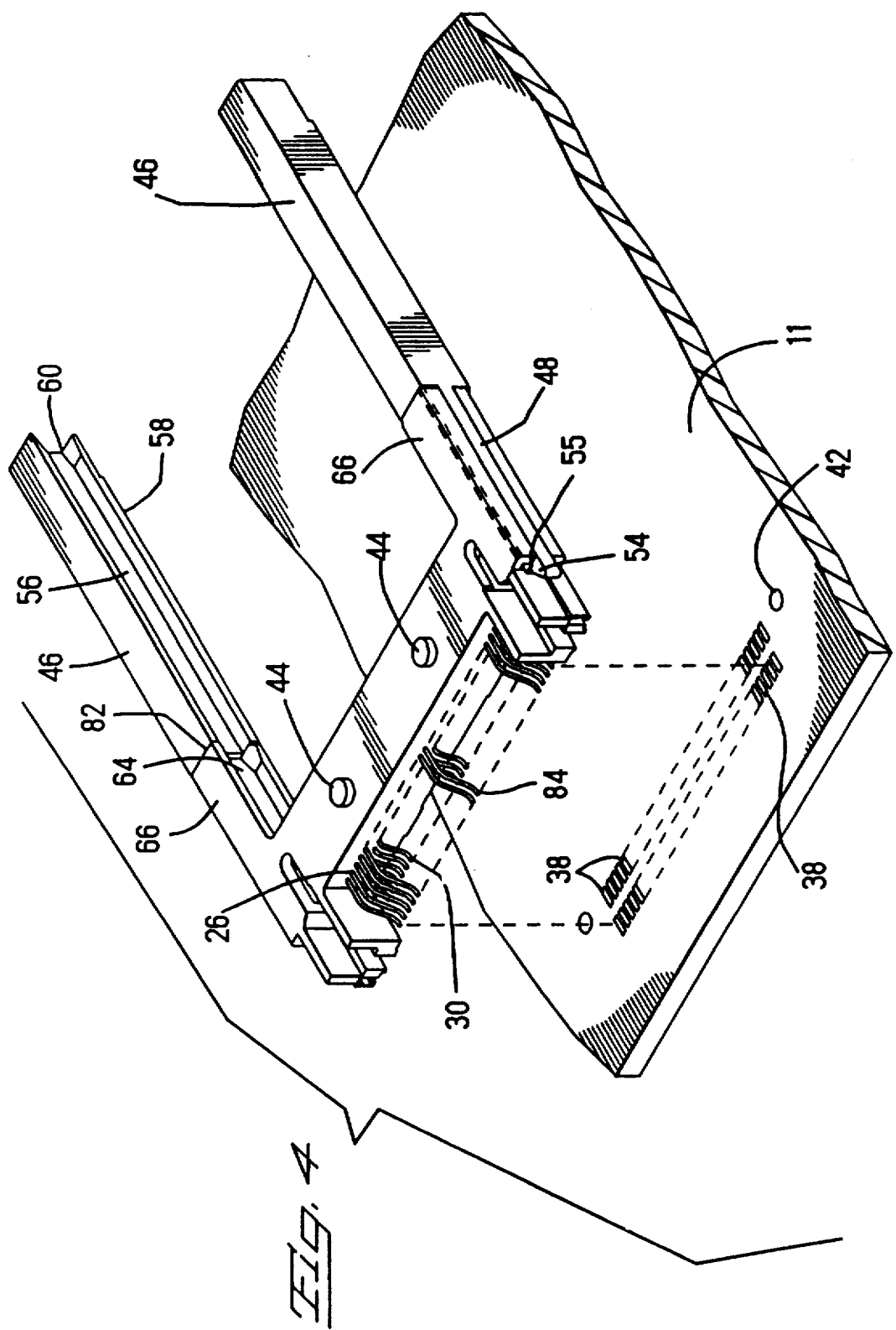
FIG. 4 is a perspective view of an assembled electrical connector according to the present invention.

Turning to FIG. 4, the electrical connector of FIG. 3 is shown with the guide arms 46 secured to the housing 12. As shown in FIG. 4, the electrical connector 10 Comprises electrical contacts 20 including first electrical contacts 26 retained in a first row of passages (not shown) and second electrical contacts 30 retained in a second row of passages (not shown). The tail sections 22 of the electrical contacts 20,26,30 extend rearwardly and downwardly from the rear surface 16 of the housing 12, the longer tail sections 34 of the first electrical contacts 26 extending rearwardly and downwardly in a first plane and the shorter tail sections 36 of the second electrical contacts 30 extending rearwardly and downwardly in a second plane which is different than the first plane. Each of the above planes defines a pathway for the tail sections 34,36 to engage the conductive paths 38 on the circuit board 11, the conductive pads 36 being staggered to conform with the orientation of the tail section 34,36 dictated by each plane.

A fitted opening 40 on the housing 12 and an aperture 42 in the circuit board are designed to receive securing means (not shown) for securing the electrical connector to the circuit board. Means to ensure proper polarization, a knob, 44 is disposed on the top surface 18 of the housing 12.

Guide arms 46 are shown attached to the housing 12 via the insertion of an extended prong 48 on the guide arm 46 into a guide arm receiving groove 50 on the side surface 52 of the housing 12 until a locking latch 54 on the extended prong 48 fits into place over a latch shoulder 55 on the housing 12. As shown in FIG. 4, the assembled electrical connector comprises a continuous groove extending from the groove mouth 60 to the front surface 14 of the housing 12 which is adapted to allow connection of a memory card or other suitable external circuitry medium to the post ends (not shown) of the electrical contacts 20,26,30, and thus to the circuit board 11.

Figure 5:
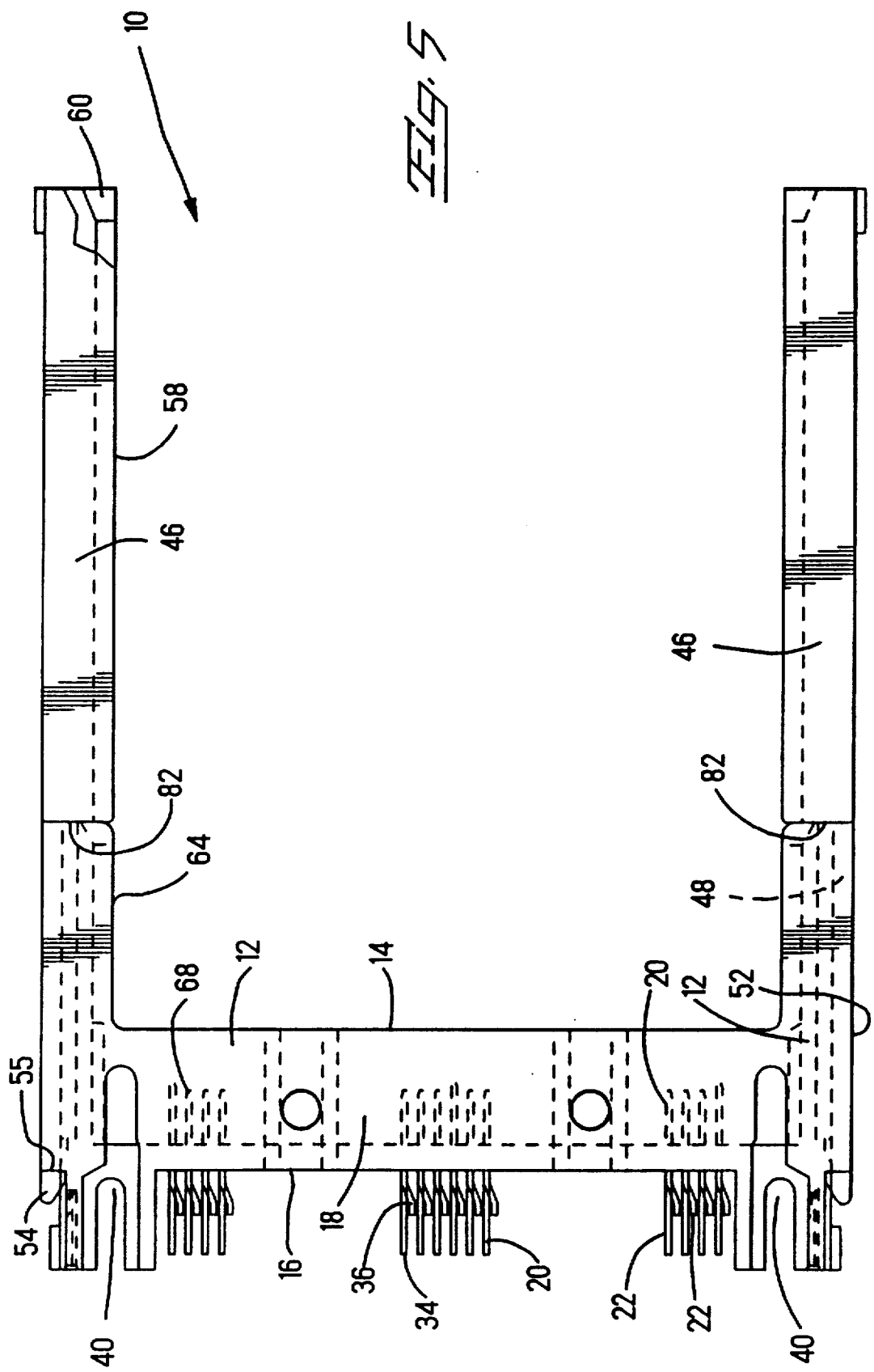
FIG. 5 is a top view of a the electrical connector in FIG. 4.

FIG. 5 illustrates a partial cut away top view of an electrical connector of the present invention as in FIG. 3. Electrical contacts 20,26,30 retained in substantially parallel and straight rows of passages (not shown) communicate the rear surface 16 with the front surface 14 of the housing 12. The electrical contacts 20,26,30 are arranged in parallel rows corresponding to the parallel rows of passages (not shown) in the housing 12. First electrical contacts 26 are retained in a first row of passages (not shown) and second electrical contacts 30 are retained in a second row of passages (not shown). First electrical contact tail sections 34 and second electrical contact tail sections 36 extend from the rear surface 16 of the housing 12. Tail sections 34 of the first electrical contacts 26 extend rearwardly and downwardly from the rear surface 16 of the housing 12 in a first plane, and tail sections 36 of the second electrical contacts 30 extend rearwardly and downwardly from the rear surface 16 of the housing 12 in a second plane which is different from the first plane. As shown in FIG. 5, the free ends 84 of the tail section 34 of the first electrical contacts 26 are offset from the free ends 84 of the tail sections 36 of the second electrical contacts 34 permitting visual inspection of the connection of the tail sections 34,36 to the conductive pads (not shown) of a circuit board. In this way, the connectors of all electrical contacts 26,30 in the electrical connector 10 are easily accessible for inspection and repair.

By visual inspection applicants intend indicate that each of the free ends of the electrical contacts 20,26,30 in the first and second rows of passages (not shown), and thus their connection to the printed circuit board (not shown) are visible from a line of sight extending substantially perpendicular to the printed circuit board. In this manner, the contact points (not shown) of the electrical contacts 20,26,30 are susceptible to visual inspection, either manually or via optical beam devices commonly in use in industry.

Further shown in FIG. 5, post sections 68 of the first electrical contacts 26 and post sections (not shown) of the second electrical contacts 30 extend frontwardly from the front surface 14 of the housing 12.

Fitted opening 40 is shown which is disposed to be aligned with a corresponding aperture on the circuit board (not shown) so that securing means (not shown), by way of example a screw, may be inserted therein to secure the electrical connector 10 to the circuit board (not shown). Means to ensure proper polarization 44 are shown on the top surface 18 of the housing 12.

Guide arms 46 extend from the front surface 14 of housing 12. Guide arms 46 are attached to the housing 12 at the front surface 82 of housing arm 66 via extended prong (shown in cut away) 48 on guide arm 46 which is inserted into a guide arm receiving groove (not shown) on the side surface 52 of the housing 12, and locked into place by locking latch 54 on the end of the extended prong 48 which fits over latch shoulder 55 on the side surface 52 of the housing 12.

As shown in FIG. 5, the assembled electrical connector 10 comprises a continuous groove from groove mouth 60 to the front surface 14 of the electrical connector 10 to fit a memory card or other suitable external electrical circuitry element (not shown) to be connected to electrical contacts 20.

Figure 6:
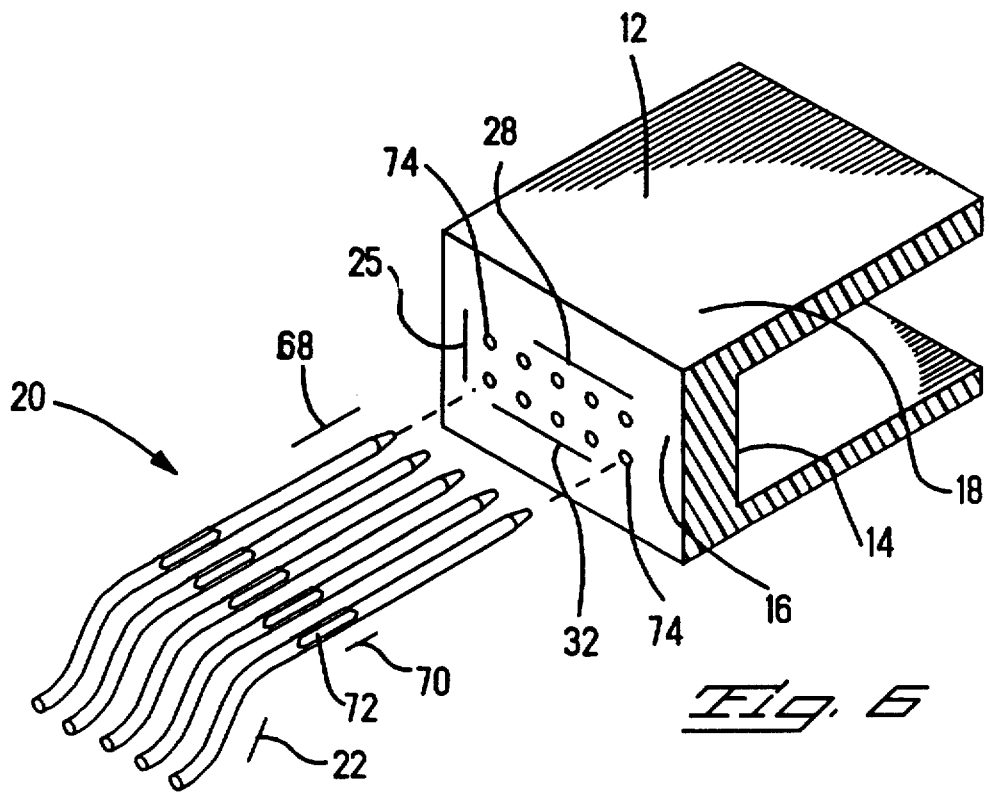
FIG. 6 is a perspective view of the unassembled electrical connector according to the present invention showing the housing and electrical contacts.

Turning to FIGS. 6-9, a preferred method for inserting electrical contacts 20 into a housing 12 is shown. In FIG. 6, a housing 12 is shown comprising a front surface 14 and a rear surface 16 with passages 74 making up two parallel rows of passages 25 extending horizontally comprising a first row of passages 28 and a second row of passages 32, which passages communicate the front surface 14 to the rear surface 16 of housing 12. Each of the passages in a given row is vertically aligned with a corresponding passage in the other row. Electrical contacts 20 comprise post sections 68, intermediate sections 70 and tail sections 22, the tail sections extending rearwardly and downwardly and ending with a free end, such as a foot, 84. The intermediate section 70 of the electrical contacts 20 comprise raised ridges 72, which raised ridges 72 are spaced at 90° from each other on the surface of the contacts.

Figure 7:
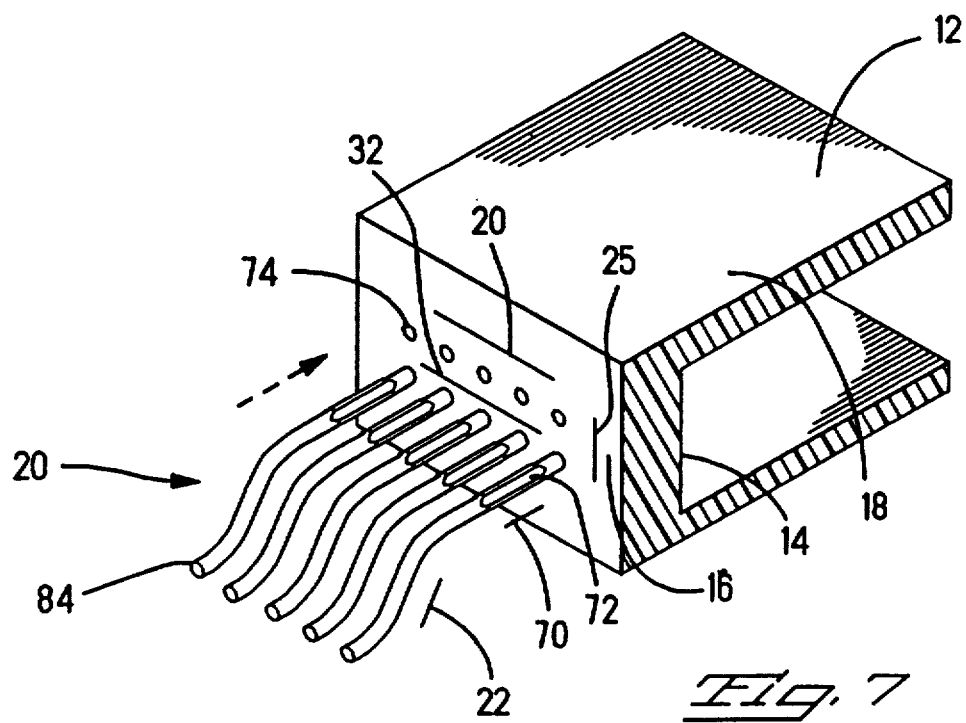
FIG. 7 is a perspective view of an unassembled electrical connector according to the present invention showing the housing with the post end of the electrical contacts inserted into the second row of passages.

FIG. 7 illustrates the insertion of the electrical contacts, 20 into a second row of passages 32. The post sections (not shown) of the electrical contacts 20 are inserted into the second row of passages 32 at the front surface 14 of the housing 12 along the direction of the arrow.

FIG. 8 illustrates electrical contacts 20 which have their post sections 68 inserted into the second row of passages 32, while the raised ridges 72 on the intermediate sections 70 of the electrical contacts are not yet inserted into the passages 32. The electrical contacts 20 are rotated about the axis of sections C in the counterclockwise direction to displace plane A-B-C created by their tail sections 22.

Figure 9:
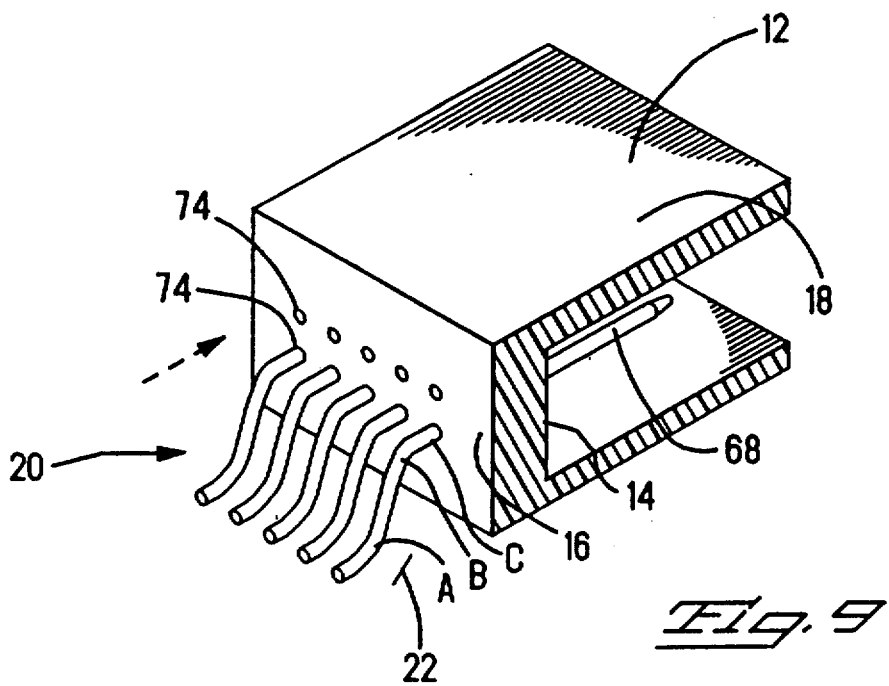
FIG. 9 is a perspective view of an electrical connector according to the present invention with rotated electrical contacts fully inserted into the second row of passages.

FIG. 9 illustrates electrical contacts 20 fully inserted into their respective passages 74, their post sections extending frontwardly from the front surface 14 of the housing 12, and the tail sections 22 extending rearwardly and downwardly from the rear surface 16 of the housing 12. Upon full insertion, the raised ridges 72 on the surface of the intermediate sections 70 of the electrical contacts 20 are placed in contact with the walls of the passages (not shown), thereby forming an interference fit between the electrical contact 20 and the housing 12 and securing the electrical contacts 20 in the housing 12. Plane A-B-C is maintained so as to assure paper displacement from a vertical axis through the passages 74.

FIGS. 10 and 11 further illustrate the insertion of the electrical contact 20 into a passage 74. FIG. 10 shows a cut away view of a rotated and partially inserted electrical contact 20 comprising a tail section 22, an intermediate section 70 and a post section 68. The electrical contact 20 is not fully inserted so that the ridges 72 on the intermediate sections 70 remain outside the housing 12. The electrical contact 20 is inserted along the A and B arrows into the passage 74 of the housing 12. FIG. 11 shows the rotated and inserted electrical contact 20 where the raised ridges 72 are in contact with the walls of the passages 74.

FIGS. 12a, 12b and 12c show cross sections of electrical contacts 20. FIG. 12a shows the cross section of the partially inserted electrical contact along the line A—A of FIG. 10. As shown in FIG. 12a, the surface 76 of the electrical contact 20 is flush against the wall 78 of the passage 74. In FIG. 12b, a cross-section of the electrical contact 20 is shown taken along the line B—B of FIG. 10. As shown in FIG. 12b, the raised ridges 72 of the electrical contact 20 protrude above the surface 76 of the electrical contact 20. FIG. 12c shows a cross section of the inserted electrical contact taken along the line C—C of FIG. 11, and shows the interference fit of the raised ridges 72 of the intermediate sections 70 of the electrical contact 20 against the wall 78 of the passage. In this way, the electrical contact 20 is firmly retained in the passage 74 and is prevented from moving about in or exiting the passage 74 of the housing 12.

Turning to FIG. 13, a cross-sectional view of an electrical connector 10 of FIG. 3 taken along the x—x axis. Housing 12 is shown with a front surface 14, a rear surface 16 and a top surface 18. Electrical connectors 20 are retained in two parallel rows of passages (not shown) in the housing 12 which communicate the front surface 14 with the rear surface 16. First electrical contact 26 is retained in a first passage (not shown), and second electrical contact 30 is retained in a second passage (not shown). Electrical contacts 20,26,30 include tail sections 22,34,36 which extend rearwardly and downwardly from the rear surface 16 of the housing 12 to a free end 84 which connects to a contact point on a circuit board (not shown), intermediate sections (not shown) retained in the passages (not shown) of the housing 12, and post sections 69 which extend frontwardly from the front surface 14 of the housing 12.

Projecting rearwardly from the housing 12 is a side surface 80 of a fitted opening for securing the housing 12 to a circuit board (not shown). Projecting forwardly from the front surface 14 of the housing 12 is an arm 66 having a groove 62 on its inside surface 64. Attached to the arm 66 at a front surface 82 is a guide arm 46 having a guide groove 56 and a groove mouth 60 on its inside surface 58. As attached in FIG. 13, a continuous groove extends from the groove mouth 60 on the guide arm 46 to the front surface 14 of the housing 12 comprising the guide groove 56 and the groove 62 on the housing arm 66. The continuous groove is adapted to guide a memory card or other suitable external circuitry device (not shown) into the front surface 14 of the housing 12 to make an electrical connection with the post sections 68 of the electrical contacts 20,26,20. Means to ensure proper polarization, a knob, 44 projects from the top surface 18 of the housing 12.

Variations on the above embodiments are possible. Merely by way of example, the upper row of contacts may be straight, and the lower row of contacts rotated, or the upper row of contacts may be rotated, and the lower row of contacts straight, or both rows may be rotated in opposite directions in the same direction so as to allow visual inspection and repair after soldering.

Figure 14:
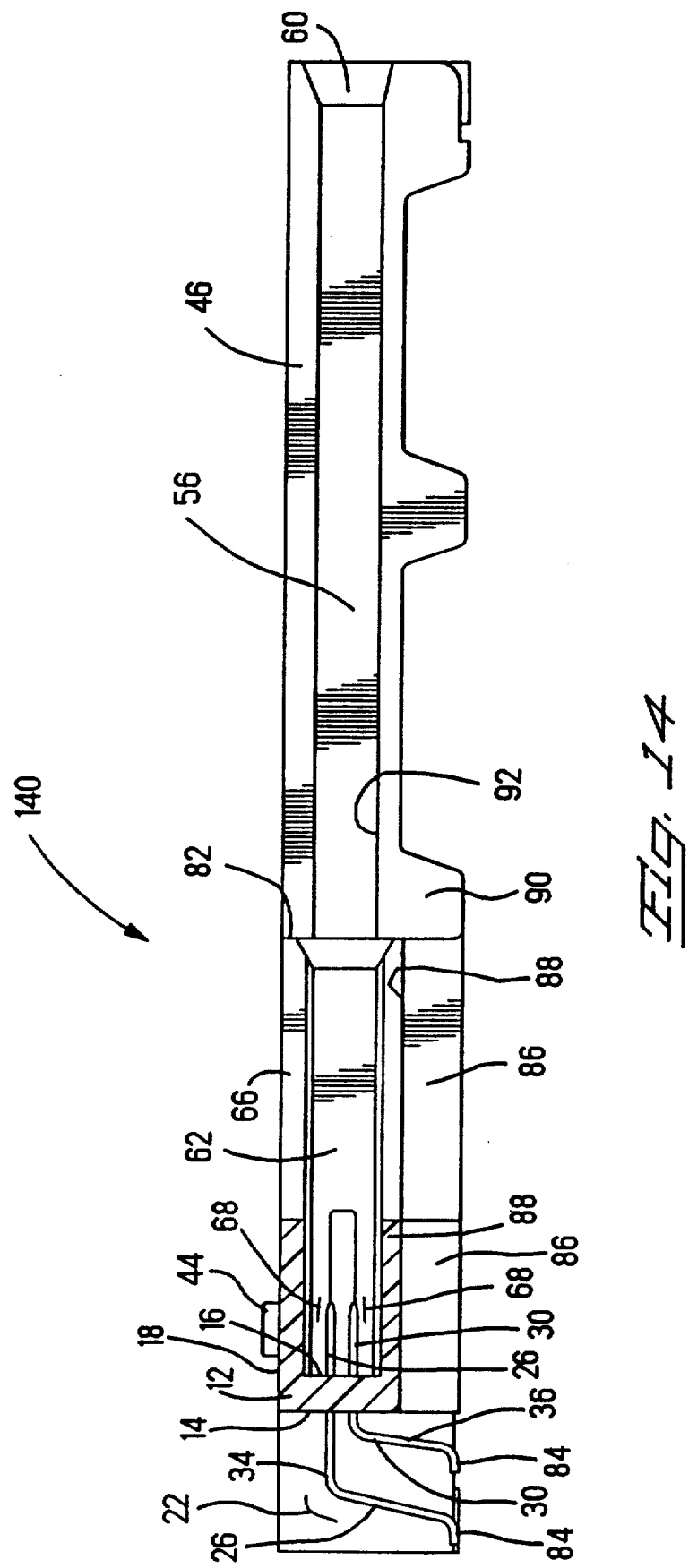
FIG. 14 is a cross-sectional view of a variation of an electrical connector according to the present invention.

In one variation, FIG. 14 shows a cross sectional view of an electrical connector 140 including electrical contacts 20,26,30 with post sections 68 extending forwardly from the front surface 14 of the housing 12, intermediate sections (not shown), and tail sections 22 extending rearwardly and downwardly from the rear surface 16 of the housing 12 to a free end 84. A base 86 extends from the bottom surface 88 of the housing 12 so as to displace the housing 12 and contacts 20,26,30 away from a mounting surface, for example a circuit board, (not shown). A base 90 also extends from the bottom surface 92 of the guide arm 46 to further support the electrical connector 10 in a displaced position with respect to a mounting surface, e.g., a circuit board (not shown).

Figure 15:
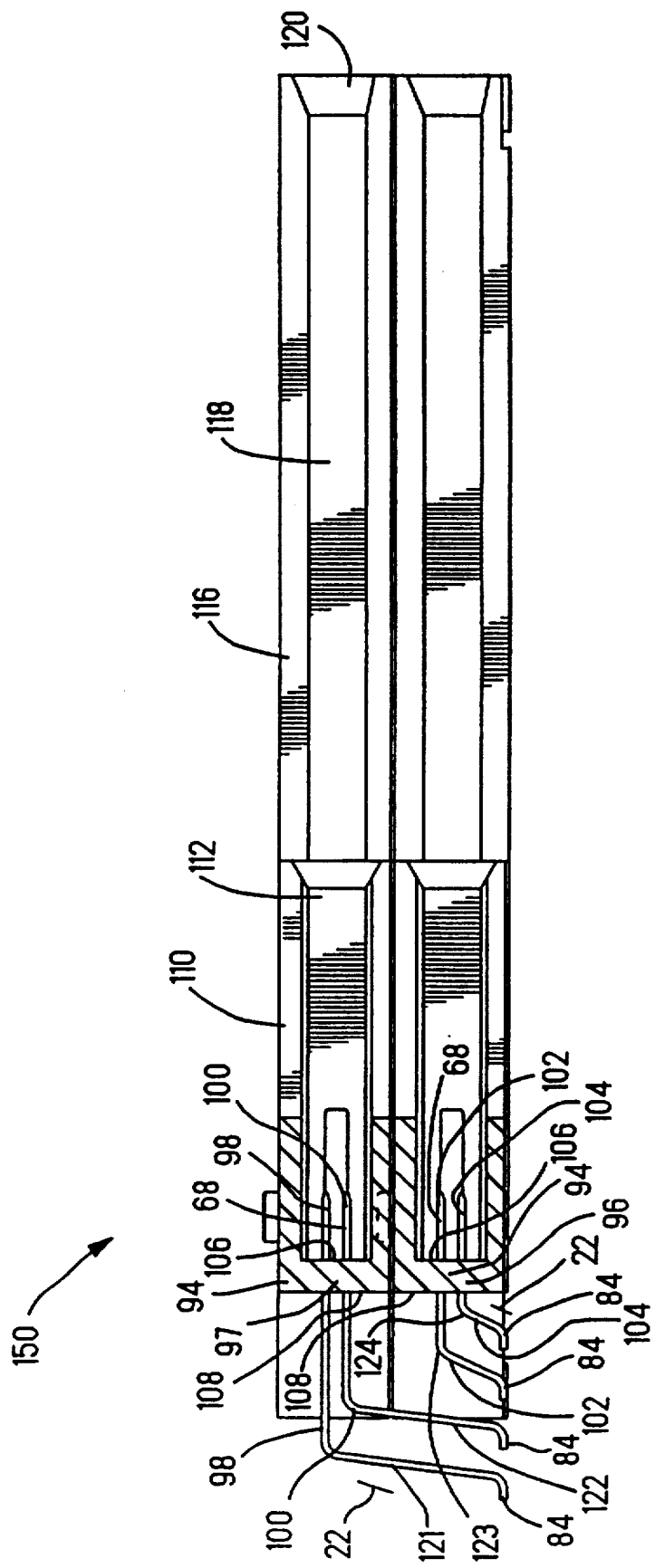
FIG. 15 is a cross-sectional view of a further variation of stacked electrical connectors according to the present invention.

In another variation, FIG. 15 shows an electrical connector 150 comprising a housing assembly 94 comprising a lower housing element 96 and an upper housing element 97 in a stacked relationship. As shown in FIG. 15, electrical contacts 20 are positioned such that a first electrical contact 98, second electrical contact 100, third electrical contact 102 and fourth electrical contact 104 are vertically aligned. The electrical contacts 20,98,100,102,104 have tail sections 22 extending rearwardly and downwardly from the front surface 104 of the housing assembly 94 to free ends 84. In FIG. 15, the tail section 123 of the second electrical contact 100 and the tail section 124 of the fourth electrical contact 104 are rotated about their axis so that the plane formed by their tail sections 123,124 is different than the plane formed by the tail section 121 of the first electrical contact 98 and the tail section 122 of the third electrical contact 102. In this way the free ends 84 of the second 100 and fourth electrical contact 104 are offset from the free ends of the first 98 and third electrical contact 102 when connected to a conductive pad of a circuit board (not shown) allowing ease of access and repair. The electrical contacts 98,100,102,104 also have intermediate sections (not shown) retained in passages (not shown) which communicate the rear surface 106 and the front surface 108 of the housing elements, and post sections which extend from the front surface 108 of the housing elements 96,97.

Extending from the front surface 108 of the housing elements 96,97 are arms 110 containing a groove 112. Secured at the front surface 114 of the arm 110 is a guide arm 116 containing a groove 118 which corresponds to the groove 112 on the arm 110 of the housing elements 96,97. As assembled, the electrical connector 10 has a continuous groove comprising the groove on the arm 110 of the housing elements 96,97 and the groove 118 on the guide arm 116 from the groove mouth 120 to the front surface 108 of the housing elements 96,97, the groove fitted to receive a memory card or other external circuitry device (not shown). Also shown in FIG. 15 is knob 44 which fits a corresponding slot (now shown) on the bottom surface of the upper housing element 97 and ensures that the respective housing elements 96,97 are aligned when stacked.

Figure 16:
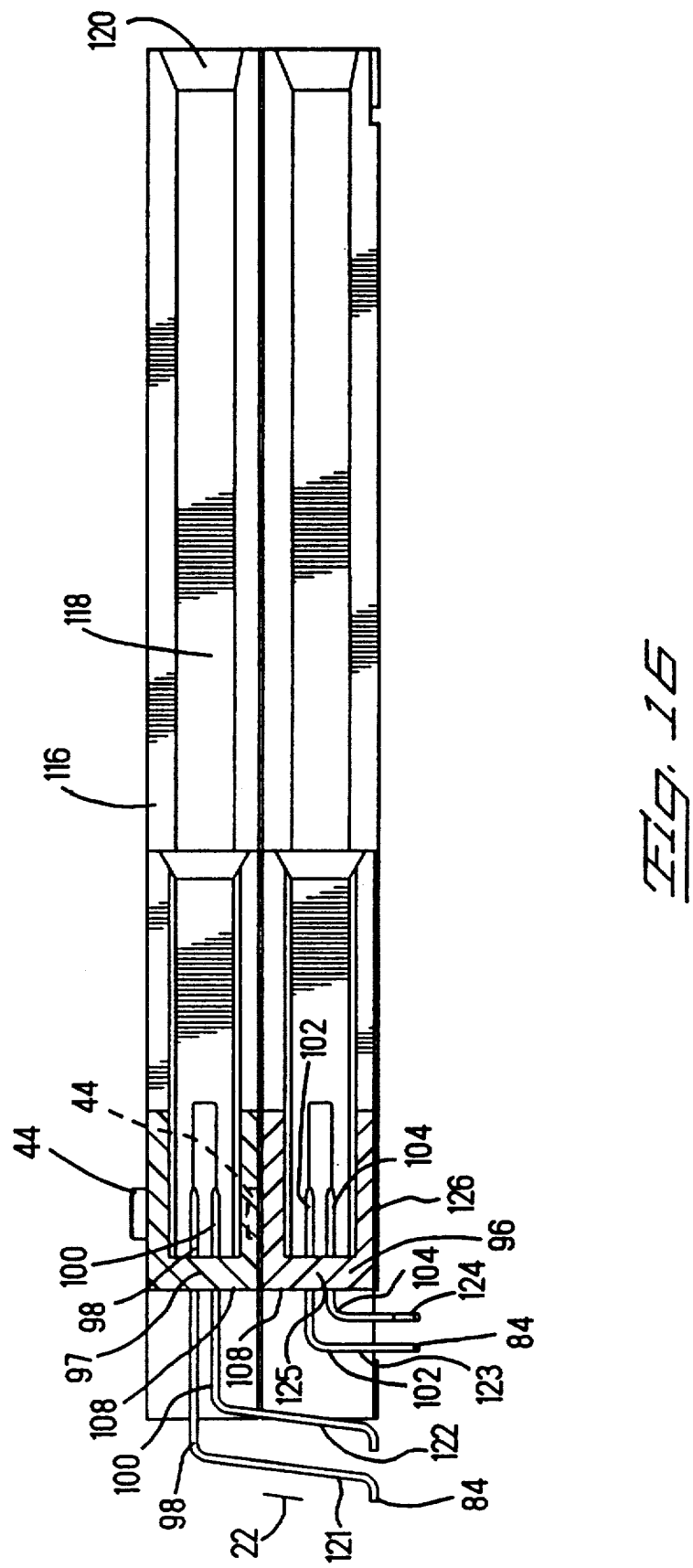
FIG. 16 is a cross-sectional view of a variation of stacked electrical connectors according to the present invention.

In yet another variation, FIG. 16 illustrates an electrical connector 150 as shown in FIG. 15 wherein the first 98, second 100, third 102 and fourth 104 electrical contacts have tail sections 22 which extend rearwardly and downwardly from the front surface 108 of the housing element 96. The tail section 121 of the first electrical contacts 98 and the tail section 122 of the second electrical contacts 102 extend rearwardly and downwardly to a free end 84 which is parallel to the contact point surface of a circuit board (not shown), while the tail sections 123 of the third electrical contacts 102 and the tail sections 124 of the fourth electrical contacts 104 extend rearwardly and downwardly to a free end 84 which is perpendicular to the contact point surface of a circuit board (not shown).

In yet another variation, FIG. 17 illustrates an alternative configuration of an electrical connector 160 wherein the lower housing element 96 has at a bottom surface 126 a base 128 which acts to displace the electrical connector away from the mounting surface (not shown), for example a circuit board. The guide arms 116 also have at their bottom surface 130 a base 132 which also acts to displace the electrical connector from the mounting surface (not shown).

Additional other variations on the embodiments described above are possible. For example, while the passages in the housing are generally horizontal and perpendicular to the front and rear housing, the passages may also be skewed or inclined when formed within the housing. Further, while straight passages are described, the invention described herein is equally applicable to arcuate, or other smooth bending passages, so long as insertion of the electrical contacts maybe accomplished. Alternatively, the electrical contacts may be preformed in a deflection pattern so that the contacts are set in their proper position and the housing is molded around the contacts. Electrical contacts can be any known in the are method for forming an electrical connection which is compatible with a circuit board. For example, pin contacts are suitable, as are flat contacts. Moreover, the tail sections of vertically aligned electrical contacts may be angled in a number of ways to effect the offset necessary to ensure ease of visual inspection and repair. For example, given an electrical connector with two parallel rows of passages, the contacts in one of the rows of passages may be rotated, or both rows of contacts may be rotated in the same or a different direction, ensuring that the free ends of the contacts in the lower row (or rows) of passages are set off from the upper contacts to ensure visibility of the connection to the circuit board.

Connection means for connecting the electrical contact to contact points on the circuit board may be any art known method of making such a connection. Usually these connections are a solder connection, but alternative structures, for example, a slot or groove adapted to receive a pin contact, or a biased spring contact which is inserted into a female opening on the circuit board are also suitable.

The electrical connectors according to the present invention are useful for any application for which high density electrical contact assemblies are used. In particular, the present invention is advantageous in attaching electrical contact assemblies to a circuit board, for example in connecting the contacts of a memory card input connector housing.

These embodiments provide the important advantages of facilitating ease in identifying and repairing defective contact connections in high density electrical connectors.

Of course, it should be understood that a wide range of changes and modifications can be made to the preferred embodiment described above. It is therefore intended that the foregoing detailed description be understood that it is the following claims, including all equivalents, which are intended to define the scope of this invention.

We claim:

1. An electrical connector for mounting on a printed circuit board comprising:
   a housing assembly comprising a lower housing and an upper housing positioned in stacked relationship to said lower housing, said housing assembly having first, second, third and fourth parallel rows of passages disposed to communicate a front surface and a rear surface of said housing assembly, said upper housing having said first row of passages being located above said second row of passages, said lower housing having said third row of passages located above said fourth row of passages, each row of said passages extending substantially straight through said housing assembly;

a plurality of electrical contacts retained in the passages of said first, second, third and fourth rows, said contacts comprising post sections, intermediate sections and tail sections, said post sections extending forwardly from said front surface of said housing assembly, said intermediate sections retained in said passages and said tail sections extending rearwardly and downwardly from said rear surface of said assembly, the electrical contacts retained in said first, second, third and fourth rows of passages being disposed such that the tail sections of the electrical contacts retained in one of said rows of passages define a first plane, the tail sections of the electrical contacts retained in another of said rows of passages define a second plane, the tail sections of the electrical contacts retained in another of said rows of passages define a third plane, and the tail sections of the electrical contacts retained in another of said rows of passages define a fourth plane;

whereby said tail sections of each of the electrical contacts are disposed within said first, second, third, and fourth planes to be connected to a corresponding contact point on said circuit board via a connecting means in such a way that the contact point of an electrical contact retained in said first row of passages being furthest from said housing assembly and the contact points of the electrical contacts retained in said second, third and fourth rows of passages being progressively closer to said housing assembly, respectively, and the contact points of at least three of said rows of contacts being readily susceptible to visual inspection.

2. The electrical connector of claim 1, wherein each of said passages of each given row of passages being vertically aligned with a corresponding passage in each remaining row, said contact points of all of said rows of contacts being readily susceptible to visual inspection.

3. The electrical connector of claim 1, wherein said first plane defines a different plane than the second plane, the second plane defines a plane different than the third plane, and said contact points of all of said rows of contacts being readily susceptible to visual inspection.

4. A method for assembling an electrical connector for mounting on a circuit board comprising:
(1) providing a housing comprising a first and a second passage disposed to communicate a front surface and a rear surface of said housing, said first passage being disposed above said second passage and extending substantially straight through said housing;
(2) providing a first electrical contact to be retained in said first passage and a second electrical contact to be retained in said second passage, said first and second electrical contacts comprising post sections, intermediate sections and tail sections, said post sections extending forwardly from said front surface of said housing, said intermediate sections disposed to be retained in said passages and said tail sections disposed to extend rearwardly and downwardly from said rear surface of said housing,
(3) inserting said post section of one of said electrical contacts from the rear surface of the housing into said respective passage towards the front of said housing until a portion of said intermediate section nearest said tail section remains outside of said respective passage;
(4) rotating said tail section of one of said electrical contacts of step (3) about the axis of said respective passage thereby displacing said tail sections to define an inclined second plane having other than vertical alignment with said respective passage;
(5) fully inserting said intermediate section of one of said electrical contacts of step (4) into said respective passage of said housing while maintaining the rotational position of said tail section of said electrical contact to extend rearwardly and downwardly in a second plane;
(6) inserting said post and intermediate portions of said other electrical contact into said other passage of said housing in a manner where said tail section of said other electrical contact extends rearwardly and downwardly in a first plane;

whereby said tail sections of said first and second electrical contacts are disposed to be connected to a corresponding contact point on said circuit board via connecting means in such a way that said first and second electrical contacts are readily susceptible to visual inspection.

5. The method of assembling the electrical connector of claim 4 wherein step (3) includes positioning securing means on said intermediate section of said respective passage.

6. The method of assembling the electrical connector of claim 5 wherein step (3) includes said securing means having a raised portion on the surface of said contacts disposed to provide an interference fit with the walls of said passages, and step (5) includes said raised portion of said contacts engaging the walls of said respective passage of said housing.

7. The method of assembling the electrical connector of claim 6 wherein step (3) includes said intermediate sections of one of said contacts being cylindrical in shape and said means for securing said contacts includes four raised areas on the surface of the contact spaced 90 degrees from each other around the surface of said intermediate section.

8. The method of assembling an electrical connector for mounting on a printed circuit board comprising:
providing a housing having first and second parallel rows of passages disposed to communicate a front surface and a rear surface of said housing, said first row of passages being nearest a top surface of said housing and said second row of passages being below said first row of passages, each passage of said first row of passages extending substantially straight and being vertically aligned with a corresponding passage in said second row of passages;
providing electrical contacts retained in said passages comprising post sections, intermediate sections and tail sections, said post sections extending forwardly from said front surface of said housing, said intermediate sections being adapted to be retained in said passages, and said tail sections adapted to extend rearwardly and downwardly from said rear surface of said housing for connection to a circuit board;
inserting said electrical contacts into one of said parallel rows of said passages, rotating the electrical contacts so that said tail sections of said electrical contacts retained in said row of passages define a first inclined plane;
inserting the other row of said electrical contacts into the other row of said parallel rows of said passages so that said tail sections of said other electrical contacts retained in said other row of passages define a second plane; and providing connecting means for connecting said tail sections of said contacts to a contact point on said circuit board and connecting said tail sections of said contacts to said contact points, said contact point of each row of said contacts being readily susceptible to visual inspection.

9. The method of assembling an electrical connector for mounting on a printed circuit board of claim 8 wherein said other row of said electrical contacts are rotated to define said second plane.

* * * * *